(12) United States Patent
Sakamoto

(10) Patent No.: US 7,529,093 B2
(45) Date of Patent: May 5, 2009

(54) CIRCUIT DEVICE

(75) Inventor: Noriaki Sakamoto, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 66 days.

(21) Appl. No.: 11/164,522

(22) Filed: Nov. 28, 2005

(65) Prior Publication Data

US 2007/0240899 A1    Oct. 18, 2007

(30) Foreign Application Priority Data

Nov. 26, 2004   (JP)   ............................ 2004-342657

(51) Int. Cl.
*H05K 7/20* (2006.01)
(52) U.S. Cl. ................... 361/715; 174/252; 174/260; 174/261; 361/742; 361/790; 361/799
(58) Field of Classification Search ................ 361/715, 361/742, 260, 261; 174/252, 260, 261; 438/126
See application file for complete search history.

(56) References Cited

U.S. PATENT DOCUMENTS

| 5,497,291 | A * | 3/1996 | Hosen | 361/804 |
| 6,114,192 | A * | 9/2000 | Tsunoda et al. | 438/126 |
| 6,909,178 | B2 * | 6/2005 | Sakamoto et al. | 257/725 |
| 7,145,225 | B2 * | 12/2006 | Lee | 257/686 |
| 2003/0164543 | A1 * | 9/2003 | Kheng Lee | 257/706 |

FOREIGN PATENT DOCUMENTS

| EP | 0 690 499 A2 | 1/1996 |
| JP | 63-015430 | 1/1988 |
| JP | 4-124860 | 4/1992 |
| JP | 05-102645 | 4/1993 |
| JP | 10-303353 | 11/1998 |
| JP | 2001-308241 | 11/2001 |
| JP | 2003-124400 | 4/2003 |
| JP | 2006-100759 | 4/2006 |
| KR | 2006-59177 | 6/2006 |

OTHER PUBLICATIONS

Korean Office Action, dated Nov. 10, 2006.
Chinese Office Action, dated Sep. 28, 2007.
Korean Office Action, dated Jan. 22, 2007.

* cited by examiner

*Primary Examiner*—Tuan T Dinh
*Assistant Examiner*—Andargie M Aychillhum
(74) *Attorney, Agent, or Firm*—Watchstone P+D, pllc; Stephen B. Parker

(57) ABSTRACT

A first insulating layer is formed on the front surface of a circuit board, and a second insulating layer on the back surface. A conductive pattern is formed on the surface of the first insulating layer. Circuit elements are connected to the conductive pattern. Sealing resin covers the front and side surfaces of the circuit board. Furthermore, the sealing resin also covers the edge region of the back surface of the circuit board. Thus, it is ensured that the circuit board has a dielectric strength while exposing the back surface of the circuit board to the outside.

10 Claims, 9 Drawing Sheets

CIRCUIT DEVICE

CROSS-REFERENCE TO RELATED APPLICATIONS

Priority is claimed to Japanese Patent Application Number JP2004-342657 filed on Nov. 26, 2004, the disclosure of which is incorporated herein by reference in its entirety.

BACKGROUND OF THE INVENTION

1. Field of the Invention

The present invention relates to a circuit device and, more specifically, to a circuit device with heat radiation capability and dielectric strength.

2. Description of the Related Art

The configuration of a conventional hybrid integrated circuit device 100 will be described with reference to FIG. 9 (this technology is described for instance in Japanese Patent Application Publication No. Hei05-102645). A conductive pattern 103 is formed on an insulating layer 102 provided on the surface of a rectangular board 101. A circuit element 105 is fixed to the desired portions of the conductive pattern 103 to form a predetermined electric circuit. Here, a semiconductor element and a chip element are connected as circuit elements to the conductive pattern 103. Leads 104 are connected to the conductive pattern 103 formed on the edge of the board 101, and serve as external terminals. Sealing resin 103 serves to encapsulate the electric circuit formed on the surface of the board 101.

The structure of the board 101 is of two types: the first is achieved by forming the sealing resin 103 with the back surface of the board 101 exposed to the outside, thereby releasing heat effectively through the board 101 exposed to the outside; the second is achieved by forming the sealing resin 103 in such a way as to encapsulate the entire board 101 including its back surface, thereby ensuring that the board 101 has a dielectric strength and moisture resistance. In this drawing the entire board 101 is encapsulated, including its back surface. The thickness of the sealing resin 103 that covers the back surface of the board 101 is, for example, about 0.5 mm. The foregoing second structure is particularly employed in a case where the board 101 is connected to the ground potential, and therefore, the board 101 is insulated from the outside.

SUMMARY OF THE INVENTION

If the sealing resin 103 is so formed that it covers the back surface of the board 101, however, the sealing resin 103 covering the back surface of the board 101 has a poor thermal conductivity, causing a problem of reduction in overall heat radiation capability.

If the thickness (T5) of the sealing resin 103 that covers the back surface of the board 101 is small, it is expected that heat radiation capability is increased. However, if the thickness T5 of the sealing resin 103 is set to 0.5 µm or less, the following problem occurs: resin does not spread throughout the back surface of the board 101 in a molding process in which the sealing resin 103 is formed by injection molding.

Furthermore, if the back surface of the board 101 is exposed to the outside in order to increase heat radiation capability, it is difficult to ensure that the board 101 is insulated from the outside, as well as it is difficult to increase the bond strength between the board 101 and the sealing resin.

The present invention has been accomplished in view of the foregoing problems, and a main object thereof is to provide a circuit device with heat radiation capability and dielectric strength.

The circuit device of the present invention includes: a circuit board; an electric circuit constituted of a conductive pattern and a circuit element, both of which are formed on the front surface of the circuit board; and sealing resin for encapsulating the electric circuit, wherein the sealing resin covers the front and side surfaces of the circuit board as well as the edge region of the back surface of the circuit board, with the back surface of the circuit board being partially exposed.

The circuit device of the present invention includes: a circuit board having a first insulating layer on its front surface and a second insulating layer on the back surface; an electric circuit constituted of a conductive pattern and a circuit element, both of which are formed on the surface of the first insulating layer; and sealing resin for encapsulating the electric circuit, wherein the sealing resin covers the front and side surfaces of the circuit board as well as the edge region of the back surface of the circuit board, with the second insulating layer being partially exposed.

In the circuit device of the present invention the circuit board and the electric circuit are electrically connected together.

In the circuit device of the present invention, the circuit board is connected to a ground potential with the conductive pattern.

In the circuit device of the present invention, a metal board is fixed to the portion exposed from the sealing resin on the back surface of the circuit board.

In the circuit device of the present invention, an oxide film is formed on the back surface of the metal board.

In the circuit device of the present invention, a planar surface is formed, which is formed of the exposed surface of the metal board and the sealing resin.

In the circuit device of the present invention, at least 2 mm of the edge region of the back surface of the circuit board from end of the circuit board is covered with the sealing resin.

In the circuit device of the present invention, heat releasing means is fixed to the back surface of the circuit board.

The method of the present invention for manufacturing a circuit device includes the steps of: making an electric circuit constituted of a conductive pattern and a circuit device on the front surface of a circuit board; and forming sealing resin by use of a mold in such a way as to cover at least the front surface of the circuit board, wherein in the sealing resin formation step the edge region of the back surface of the circuit board, which is separated from the lower surface of the mold, is covered with the sealing resin.

In the method of the present invention for manufacturing a circuit device, a metal board is adhered to the back surface of the circuit board except for the edge region, and the edge region of the circuit board is separated from the mold by allowing the back surface of the metal board to come in contact with the lower surface of the mold.

In the method of the present invention for manufacturing a circuit device, the edge region of the circuit board is separated from the mold by placing the circuit board on a convexity provided on the mold.

The method of the present invention for manufacturing a circuit device includes the steps of: adhering a conductive foil on the front surface of a circuit board with an insulating layer interposed therebetween, and adhering a metal board on the back surface of the circuit board with an insulating layer interposed therebetween; providing a separation groove on the metal board in regions corresponding to the boundaries among units to be formed; patterning the conductive foil by etching to form a conductive pattern, removing a remaining portion on the separation groove, and exposing the back surface of the circuit board, corresponding to the edge regions of the units; separating circuit boards that constitute the units from each other by separating the circuit boards from each other at the boundaries among the units; electrically connecting a circuit element to the conductive pattern; and forming sealing resin in such a way as to cover the edge region on the back surface of the circuit board, by carrying out a resin sealing process with the back surface of the metal board being in contact with the lower surface of the mold.

In the method of the present invention for manufacturing a circuit device, the metal board is a board made of aluminum, the front and back surfaces of which have been anodized.

In the method of the present invention for manufacturing a circuit device, the separation groove is formed by dicing.

BRIEF DESCRIPTIOIN OF THE DRAWINGS

DETAILED DESCRIPTION OF THE PREFERRED EMBODIMENT

Figure 1A:
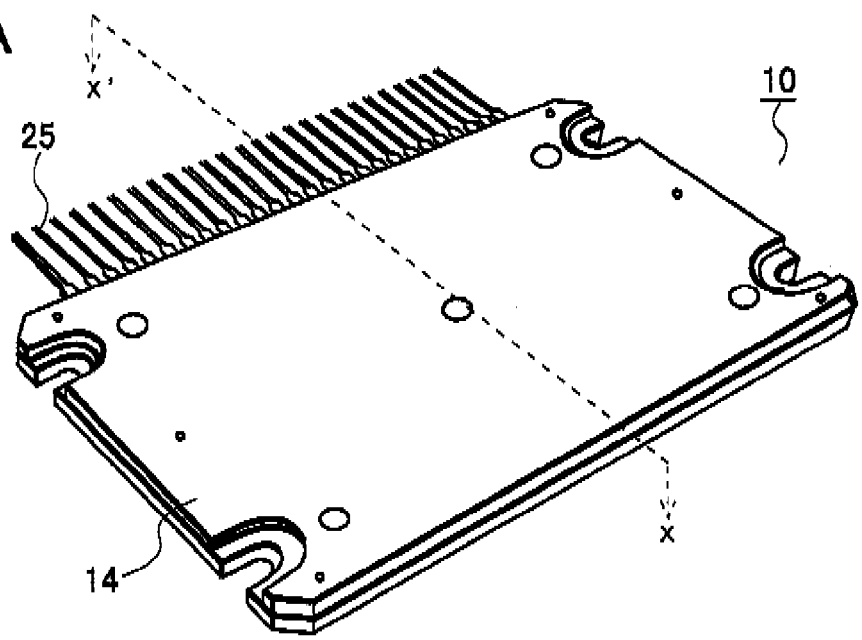
FIG. 1A is a perspective view showing a hybrid integrated circuit device of a preferred embodiment of the present invention.

The configuration of a hybrid integrated circuit device 10 of a preferred embodiment of the present invention will be described with reference to FIGS. 1A to 1C. Firstly, a first insulating layer 12A is formed on the front surface of a rectangular circuit board 11. A conductive pattern 13 of predetermined shape is then formed on the surface of the first insulating layer 12A. With solder or conductive paste, a semiconductor element 15A and a chip element 15B are electrically connected to the predetermined portions of the conductive pattern 13. The conductive pattern 13, the semiconductor element 15A and the chip element 15B, which are formed on the front surface of the circuit board 11, are covered with sealing resin 14.

The circuit board 11 is a board made of metal, such as aluminum or copper. If a board made of aluminum is adopted as the circuit board 11 by way of example, the surface of the circuit board 11 is anodized, whereby the bond strength between the first insulating layer 12A and the circuit board 11 is increased. Furthermore, it is possible to protect the surface of the circuit board 11 during an etching process in which the conductive pattern 13 is formed. The specific size (Length× Width×Thickness) of the circuit board 11 is, for example, about 61 mm×42.5 mm×1.5 mm.

The first insulating layer 12A is so formed that is covers the entire surface of the circuit board 11. The first insulating layer 12A is made of, for example, epoxy resin filled with a filler (e.g., Al2O3) with a high concentration. In this way it is possible to actively release heat generated in the built-in circuit elements, to the outside through the circuit board 11. The specific thickness of the first insulating layer 12A is, for example, about 50 μm. The first insulating layer 12A with this thickness can secure a dielectric strength (or dielectric breakdown strength) of 4 KV.

A second insulating layer 12B is so formed that it covers the back surface of the circuit board 11. The second insulating layer 12B may have the same composition as the first insulating layer 12A. Covering the back surface of the circuit board 11 with the second insulating layer 12B can ensure that the back surface has a dielectric strength. For this reason, even when heat releasing means (e.g., a radiation fin) comes in contact with the back surface of the circuit board 11, the radiation fin and the circuit board 11 are insulated from each other by the second insulating layer 12B.

The conductive pattern 13 is made of metal such as copper, and is formed on the surface of the first insulating layer 12A so as to realize a predetermined electric circuit. Moreover, pads formed of the conductive pattern 13 are formed on side surface of the circuit board 11 from which leads 25 lead out.

A connection portion 18 is a portion at which the conductive pattern 13 and the circuit board 11 are electrically connected together. In the specific structure of the connection portion 18 the conductive pattern 13 and the bottom of a hole, penetrating the first insulating layer 12A, are connected together with a metal wire 17. Establishing electrical continuity between the conductive pattern 13 and the circuit board 11 via the connection portion 18 allows them to have the same potential, thereby reducing parasitic capacitance and thus stabilizing the operation of the electric circuit formed on the front surface of the circuit board 11. For example, the circuit board 11 is connected to the ground potential via the connection portion 18.

The semiconductor element 15A and the chip element 15B, circuit elements, are fixed to the predetermined portions of the conductive pattern 13. For the semiconductor element 15A, a transistor, an LSI chip, a diode or the like can be used. Here, the semiconductor element 15A and the conductive pattern 13 are connected together with the metal wire 17. For the chip element 15B, a chip resistance, a chip condenser or the like can be used. Furthermore, for the chip element 15B, an element with electrodes on both ends (e.g., an inductance, a thermistor, an antenna, and oscillator) can be used. Furthermore, a resin-sealing package and the like can also be fixed to the conductive pattern 13 as a circuit element.

The leads 25 are fixed to the pads formed on the edge of the circuit board 11, and serve to input/output signals from/to outside devices. Here, a large number of the leads 25 are fixed to one side of the circuit board 11. Note that the leads 25 may lead out from all sides, or any two opposite sides, of the circuit board 11.

The sealing resin 14 is formed of transfer-molded thermosetting resin. In FIG. 1B, the conductive pattern 13, the semiconductor element 15A, the chip element 15B and the metal wire 17 are all encapsulated in the sealing resin 14, and the front and side surfaces of the circuit board 11 are covered with the sealing resin 14. The sealing resin 14 covers only the edge region in the back surface of the circuit board 11; the center region is not covered with the sealing resin 14 and thus exposed to the outside.

Figure 1B:
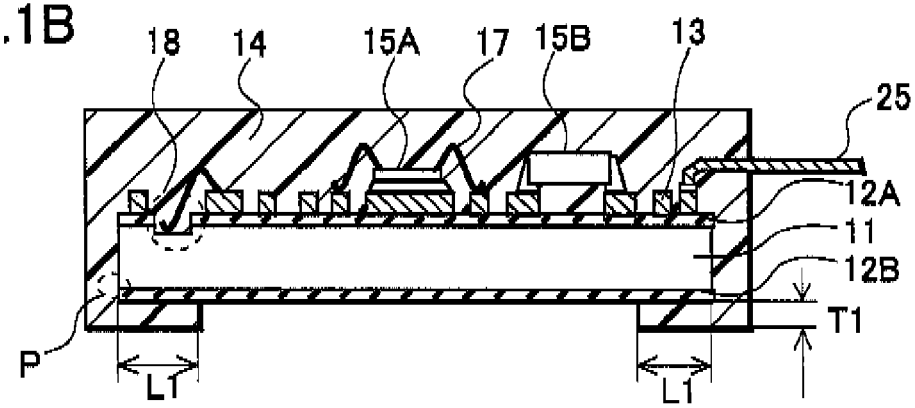
FIGS. 1B and 1C are sectional views each showing the same.

Referring to FIG. 1B, the edge region of the back surface of the circuit board 11 is covered with the sealing resin 14. In the drawing the width of the region covered with the sealing resin 14 is represented by L1. Preferably, the length (L1) is set to about 2-3 mm or more, though it varies depending on the dielectric strength required. In this way it is ensured that an end P of the circuit board 11 has a dielectric strength. More specifically, if the L1 is set to 2 mm, it is ensured that the end P has a dielectric strength of 2 KV, yet if the L1 is set to 3 mm, it is ensured that the end P has a dielectric strength of 3 KV. Note that the thickness T1 of the sealing resin 14, covering the back surface of the circuit board 11, is about 0.3 mm, for example.

In this embodiment the edge region of the back surface of the circuit board 11 is covered with the sealing resin 14, thereby ensuring that the end P of the circuit board 11 has a dielectric strength. To be more specific, the first insulating layer 12A and the second insulating layer 12B are entirely formed on the front and back surfaces of the circuit board 11, respectively. Accordingly, it is ensured that both the front and back surfaces of the circuit board 11 have a dielectric strength. By contrast, the side surface of the circuit board 11 is not covered with a resin layer and thereby a metallic surface is exposed to the outside. Thus, in order to ensure that the circuit board 11 is insulated from the outside it is necessary to prevent shorting between the side surface (especially the end P) of the circuit board 11 and outside devices, which is caused via the boundary between the circuit board 11 and the sealing resin 14. For this purpose, in this embodiment, the sealing resin 14 is formed on the edge region of the back surface of the circuit board 11 so that the end P is separated from the outside, i.e., so that the end P is encapsulated. Thus, an overall dielectric strength is secured in the circuit board 11.

Furthermore, in this embodiment, the sealing resin 14 covers only the edge region in the back surface of the circuit board 11 and other regions are exposed to the outside. For this reason, heat generated as a result of driving the semiconductor element 15A or other elements efficiently is released to the outside through the circuit board 11. Moreover, covering the edge region of the back surface of the circuit board 11 with the sealing resin 14 causes an anchor effect, increasing the bond strength between the circuit board 11 and the sealing resin 14.

Figure 1C:
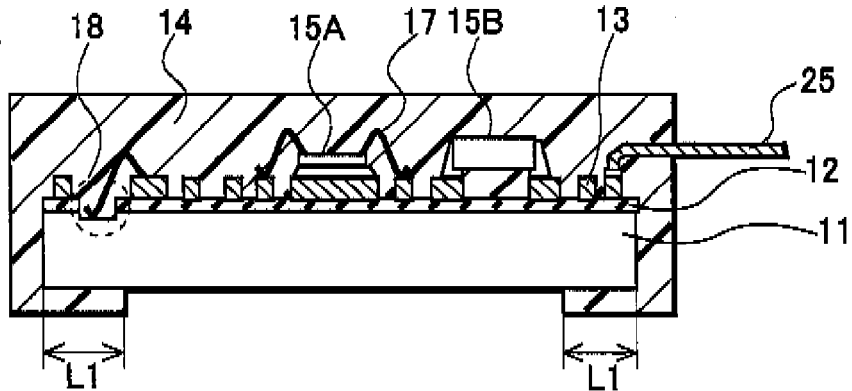

Referring to FIG. 1C, here, the back surface of the circuit board 11 is not covered with an insulating layer, and therefore, the back surface of the circuit board 11 is exposed to the outside. This configuration cannot secure a dielectric strength in the circuit board 11 but can increase heat radiation capability of the entire device. Furthermore, since the edge region of the back surface of the circuit board 11 is covered with the sealing resin 14, it is made possible to increase the bond strength between the circuit board 11 and the sealing resin 14.

Figure 2:
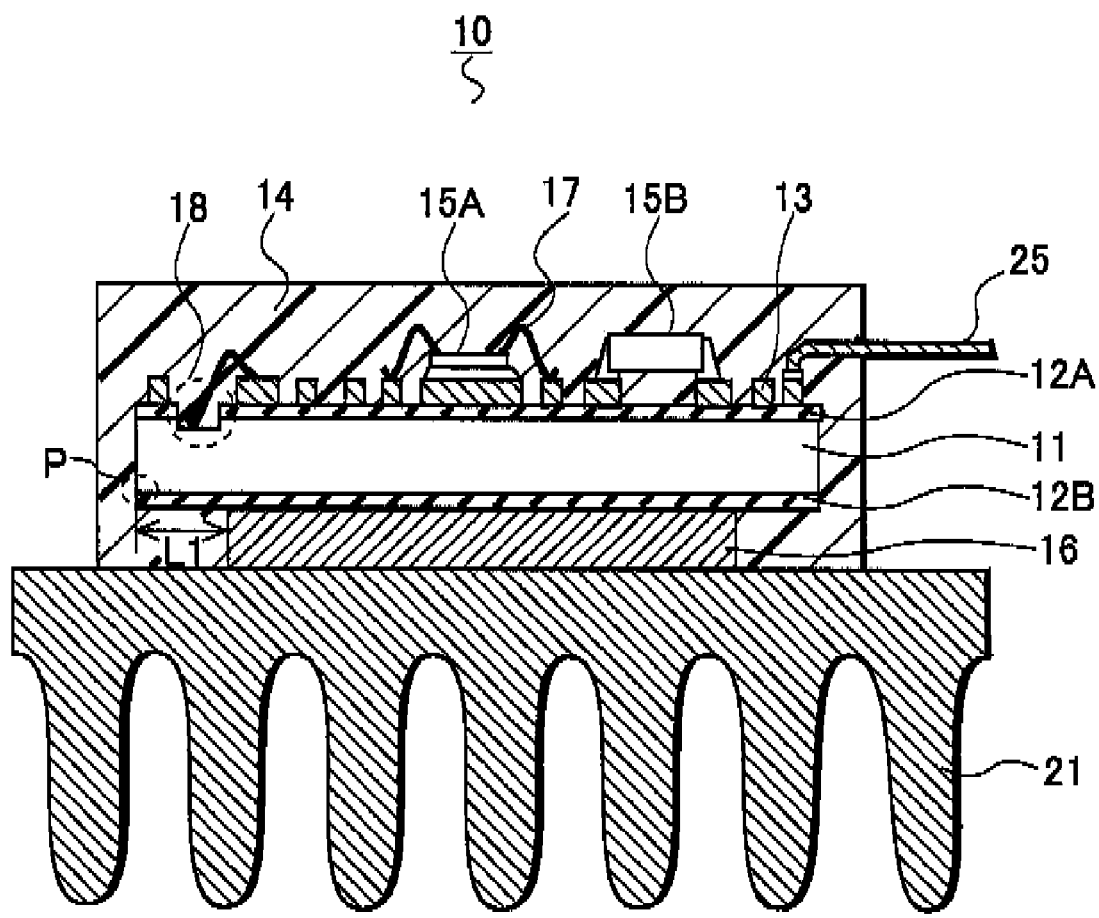
FIG. 2 is a sectional view showing the hybrid integrated circuit device of the preferred embodiment of the present invention.

Referring to FIG. 2, a radiation fin 21 is fixed to the bottom of the hybrid integrated circuit device 10. The radiation fin 21 is made of metal such as aluminum or copper. Here, a metal board 16 is fixed to the exposed back surface of the circuit board 11. The upper surface of the radiation fin 21 is connected to the bottom of the hybrid integrated circuit device 10 with the metal board 16. With this configuration, heat generated in circuit elements (e.g., the semiconductor element 15A) is released to the outside through the circuit board 11, the metal board 16 and the radiation fin 21. As described above, since the edge region of the back surface of the circuit board 11 is covered with the sealing resin 14, it is ensured that the ends P have a sufficient dielectric strength. Thus, the radiation fin 21 and the circuit board 11 are insulated from each other.

The structure of the hybrid integrated circuit device 10 will be further described with reference to FIGS. 3A to 3C.

Figure 3A:
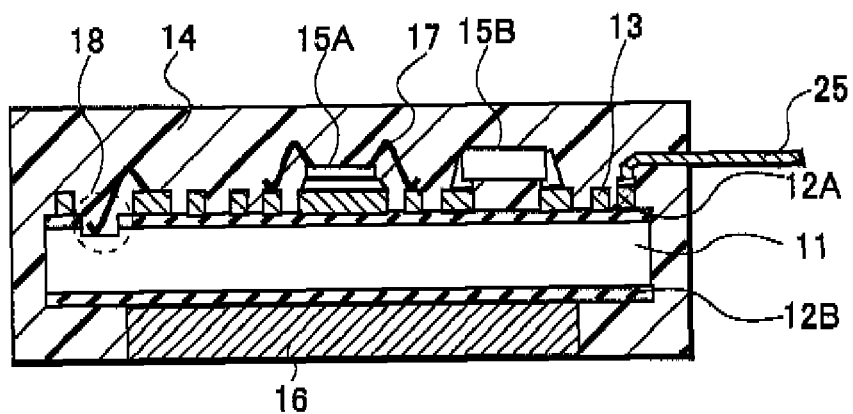
FIGS. 3A to 3C are sectional views each showing the hybrid integrated circuit device of the preferred embodiment of the present invention.

Referring to FIG. 3A, the metal board 16 is fixed to the exposed back surface of the circuit board 11. Here, the metal board 16 is adhered to the second insulating layer 12B covering the back surface of the circuit board 11. In this way a planar surface formed of both the sealing resin 14 and the metal board 16 is formed on the back surface of the hybrid integrated circuit device 10, thereby making it possible to readily allow the back surface of the hybrid integrated circuit device 10 to come in contact with heat releasing means, such as a radiation fin. For the material of the metal board 16, metals with an excellent thermal conductivity, such as aluminum or copper or can be used. In addition, a planar surface, formed of both the sealing resin 14 covering the edge region of the back surface of the circuit board 11 and the back surface of the metal board 16, is formed on the back surface of the hybrid integrated circuit device 10.

Figure 3B:
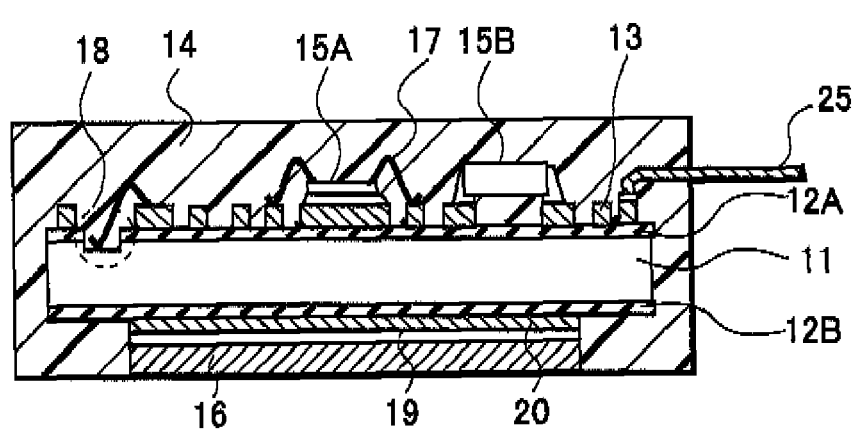

Referring to FIG. 3B, here, a metal film 20 is adhered to the back surface of the second insulating layer 12B. With an adhesive agent 19, the metal board 16 is fixed to the metal film 20. For the metal film 20, metals such as cupper can be used. Here, for the adhesive agent 19, solder can be used.

Figure 3C:
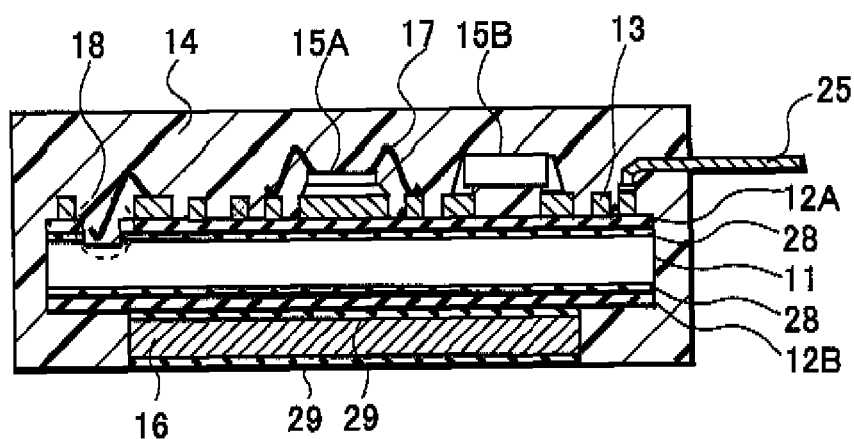

Referring to FIG. 3C, here, the metal board 16 comes in contact with the exposed back surface of the circuit board 11. Furthermore, the metal board 16 is formed of an aluminum board having an oxide film 29 formed on its front and back surfaces. The oxide film 29 is made of an anodized aluminum film formed by anodic oxidation. Here, the thickness of the metal board 16 is, for example, about 0.5 mm, whereas the thickness of the circuit board 11 is about 1.5 mm. In addition, the thickness of the oxide film 29 is, for example, about 10 μm.

Since the oxide film 29 is formed on the front surface of the metal board 16, it is made possible to increase the bonding strength between the metal board 16 and the second insulating layer 12B. In addition, since the oxide film 29 is formed on the back surface of the metal board 16, it is made possible to protect the exposed back surface of the metal board 16 against damage.

Each of the circuit devices shown in FIGS. 3A to 3C, in which two metal boards are used, is excellent in heat radiation capability, and is therefore applied to in-vehicle modules, for example. Specifically, if high output power elements, circuits that control these high power elements, microcomputers and the like are highly integrated, a conductive pattern is inevitably required to be multi-layered. At this point, resin that insulates the conductive pattern has a high thermal resistance. Therefore, to solve this problem, a package that is excellent both in heat radiation capability and sealing property can be realized by mixing a filler into the resin insulating the conductive pattern and by exposing the second metal board to the outside.

A method of manufacturing the hybrid integrated circuit device 10 with the foregoing configuration will be described with reference to FIGS. 4 to 8.

Figure 4A:
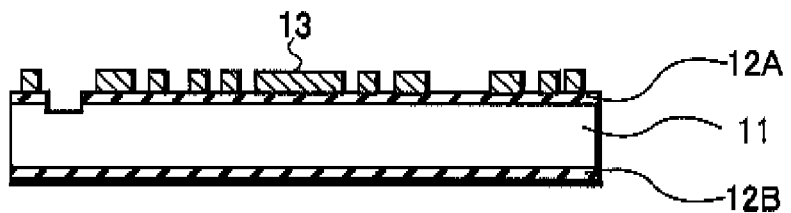
FIGS. 4A to 4D are sectional views showing the method of manufacturing the hybrid integrated circuit device of the preferred embodiment of the present invention.

Referring to FIG. 4A, a conductive pattern 13 is first formed on the front surface of a circuit board 11. A first insulating layer 12A is formed on the front surface of the circuit board 11 and a second insulating layer 12B on the back surface. Subsequently, a conductive film adhered to the first insulating layer 12A is etched to form the conductive pattern 13 of predetermined shape.

Although a single-layer conductive pattern is formed here, a multi-layer conducting pattern may be formed by laying single-layer conductive patterns on top of each other with an insulating layer therebetween.

Figure 4B:
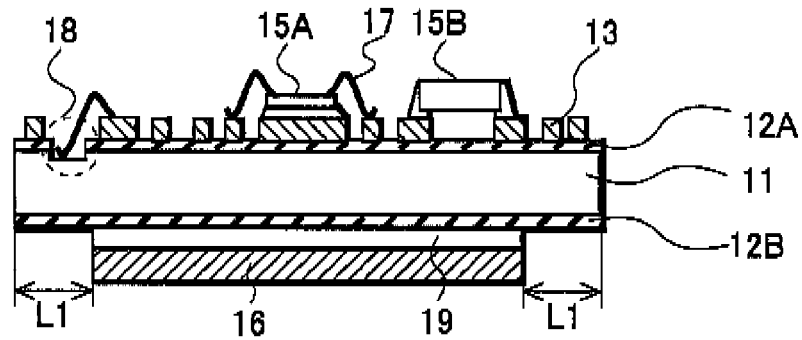

Referring to FIG. 4B, circuit elements are then electrically connected to the conductive pattern 13. Here, a semiconductor element 15A and a chip element 15B are connected to the conductive pattern 13. Moreover, a connection portion 18 is also formed which connects the conductive pattern 13 to the circuit board 11. Furthermore, a metal board 16 is fixed to the back surface of the circuit board 11 with an adhesive agent 19. The edge of the metal board 16 and the edge of the circuit board 11 are separated from each other by the foregoing distance L1. In this way a dielectric strength is ensured between the edge of the circuit board 11 and the metal board 16.

Figure 4C:
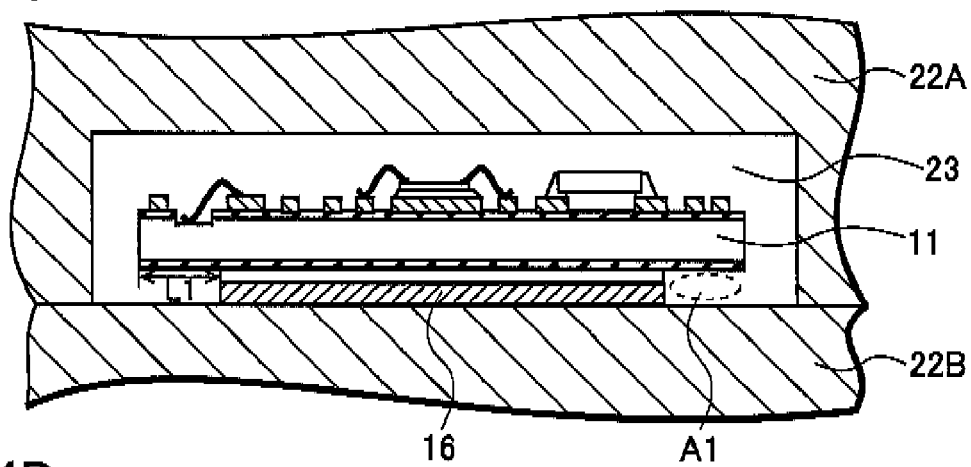

Referring to FIG. 4C, sealing resin is then formed in such a way that the electric circuit formed on the front surface of the circuit board 11 is encapsulated in the sealing resin. Here, the sealing resin is formed by transfer molding using upper and lower molds 22A and 22B, respectively. The resin sealing process is carried out in a state where the back surface of the metal board 16 comes in contact with the surface of the lower mold 22B. Accordingly, only a space Al, corresponding to the edge region of the circuit board 11, is filled with the sealing resin. The space has a width of about 2-3 mm, and is readily filled with the sealing resin. Thus, it is possible to avoid the generation of voids—spaces that are not filled with the sealing resin.

Figure 4D:
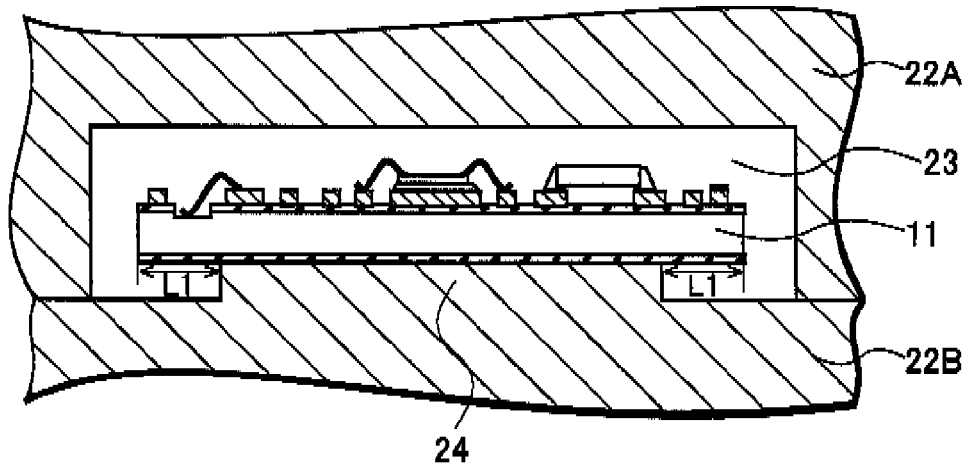

Referring to FIG. 4D, another resin sealing process will be described. Here, the back surface of the circuit board 11 is not provided with the metal board 16, and a resin sealing process is carried out in a state where the back surface of the circuit board 16 comes in contact with a convexity 24 provided on the lower mold 22B. The convexity 24 comes in contact with back surface of the circuit board 11, except for its edge region. For this reason, the edge region of the back surface of the circuit board 11 is covered with the sealing resin, whereas a part of the back surface of the circuit board 11, coming in contact with the convexity 24, is exposed to the outside.

Next, a method of manufacturing another hybrid integrated circuit device will be described with reference to FIGS. 5A to 5D. Here, the back surface of the circuit board 11 is protected by a metal film 20.

Figure 5A:
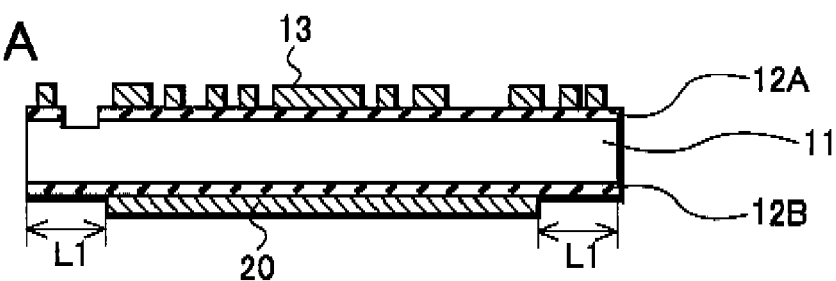
FIGS. 5A to 5D are sectional views showing the method of manufacturing the hybrid integrated circuit device of the preferred embodiment of the present invention.

Referring to FIG. 5A, first, the conductive pattern 13 is formed on the front surface of the circuit board 11. Furthermore, the metal film 20 is formed on the back surface of the circuit board 11. The conductive pattern 13 and the metal film 20 can be formed by etching conductive foils adhered to both surfaces of the circuit board 11. If the conductive pattern 13 and the metal film 20 are to be similar in thickness (e.g., about 100 μm), they can be formed simultaneously by etching. If the metal film 20 is to be thicker than the conductive pattern 13, they will be etched separately.

It is possible to protect the second insulating layer 12B by forming the metal film 20 on the back surface of the circuit board 11. If the second insulating layer 12B is partially damaged in the middle of the manufacturing process, the damaged portion has a reduced dielectric strength, resulting in the possibility of electrical shorting. In this embodiment the second insulating layer 12B is protected against damage by covering the back surface thereof with the metal film 20. The edge region of the back surface of the circuit board 11 is not covered with the metal film 20. However, since steps are formed on the back surface of the circuit board 11 due to the presence of the metal film 20, the circuit board 11 is conveyed to one process to another in the manufacturing process without causing its edge region to come in contact with any other surface. For this reason, the region of the second insulating layer 12B, which is not covered with the metal film 20, is also protected against damage.

Figure 5B:
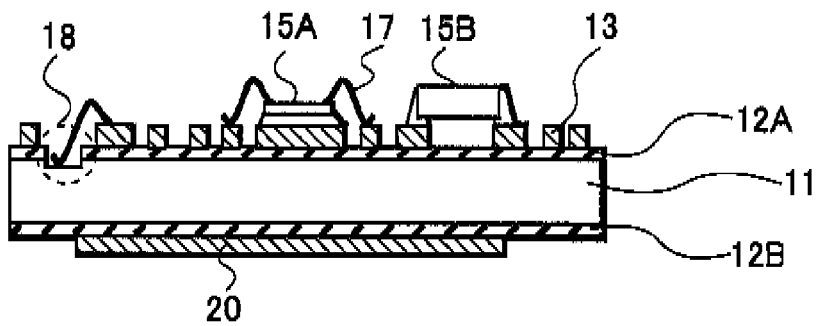

Referring to FIG. 5B, circuit elements are then electrically connected to the conductive pattern 13. The detailed description of this process is similar to that provided for the process shown in FIG. 4B.

Figure 5C:
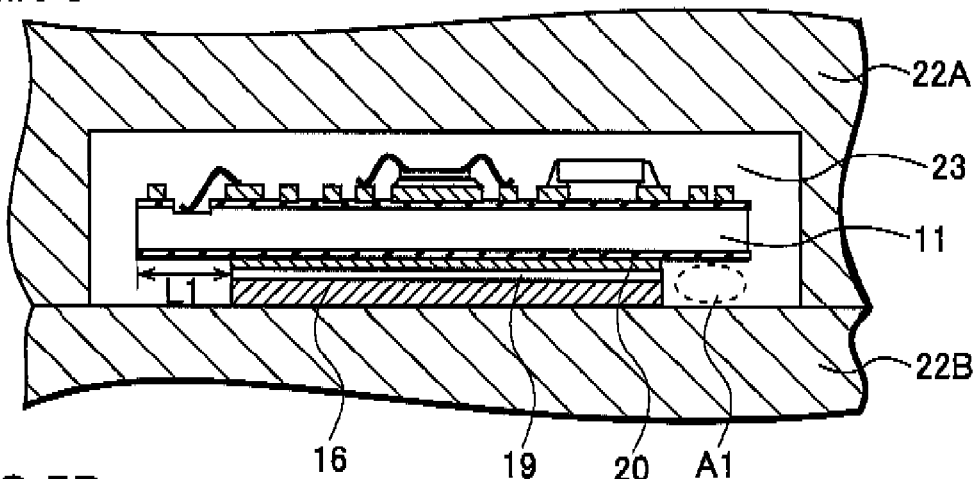

Referring to FIG. 5C, a resin sealing process is then carried out. Here, the metal board 16 is fixed to the metal film 20 with the adhesive agent 19, and a resin sealing process is carried out in a state where the bottom surface of the metal board 16 comes in contact with the lower mold 22B. Fixation of the metal board 16 allows the space Al, created below the edge region of the circuit board 11, to have a thickness of about 0.3 mm or more. Thus, sealing resin can spread throughout the space Al.

Figure 5D:
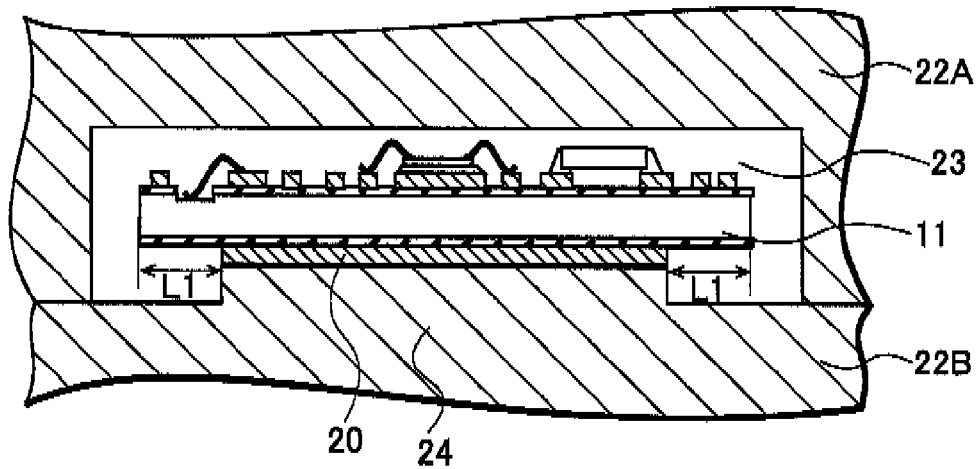

Referring to FIG. 5D, here, the back surface of the metal film 20 is allowed to come in contact with the convexity 24 provided on the lower mold 22B, and the edge region of the back surface of the circuit board 11 does not come in contact with the convexity 24. By carrying out a resin sealing process in this state, the edge region of the back surface of the circuit board 11 is covered with a sealing resin 14, and the metal film 20 is exposed from the sealing resin to the outside.

A method of manufacturing another hybrid integrated circuit device will be described with reference to FIGS. 6A to 6E. Here, the metal film 20 formed on the back surface of the circuit board 11 is thicker than the conductive pattern 13 formed on the front surface thereof.

Figure 6A:
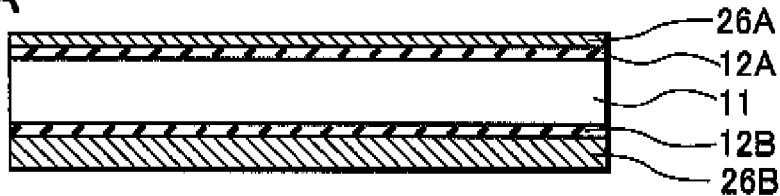
FIGS. 6A to 6E are sectional views showing the method of manufacturing the hybrid integrated circuit device of the preferred embodiment of the present invention.

Referring to FIG. 6A, the circuit board 11 that has a conductive foil adhered to its front and back surfaces is first prepared. A first conductive foil 26A is formed on the entire front surface of the circuit board 11 with the first insulating layer 12A interposed therebetween. The thickness of the fist conductive foil 26A is similar to that of the conductive pattern 13 to be formed. The fist conductive foil 26A has a thickness of, for example, about 100 μm. A second conductive foil 26B is adhered to the entire back surface of the circuit board 11 with the second insulating layer 12B interposed therebetween. The second conductive foil 26B has a thickness of, for example, about 300 μm.

Figure 6B:
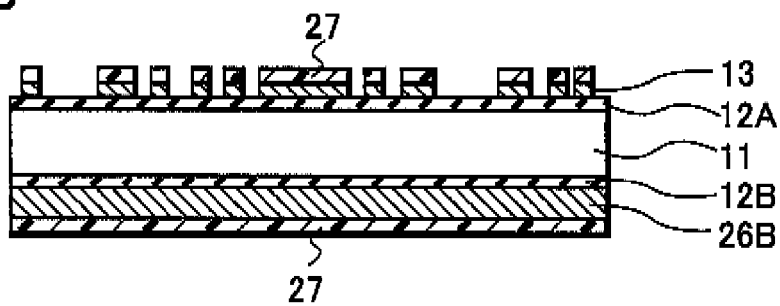

Referring to FIG. 6B, the first conductive foil 26A is then etched to form the conductive pattern 13. Specifically, after selectively covering the surface of the first conductive foil 26 with a resist 27, the first conductive foil 26A is etched to form the conductive pattern 13. In this process the second conductive foil 26B formed on the back surface of the circuit board 11 is entirely covered with the resist 27, and is protected against etching. Here, since the first and second conductive foils 26A and 26B are different in thickness, they are etched separately. If the first and second conductive foils 26A and 26B are etched simultaneously, undesirably, the thin first conductive foil 26A is excessively etched.

Figure 6C:
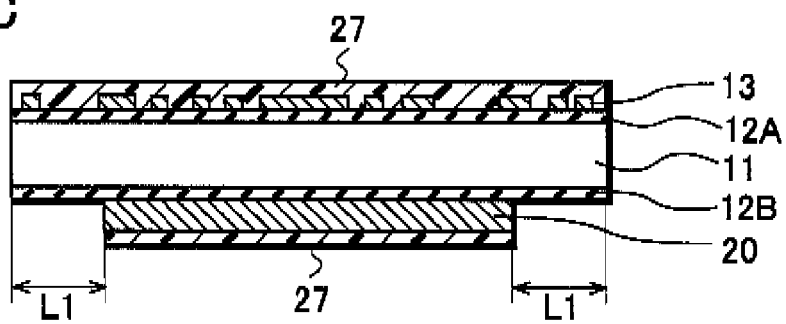

Referring to FIG. 6C, the second conductive foil 26B formed on the back surface of the circuit board 11 is then etched to form the metal film 20. Here, the second conductive foil 26B, positioned at the edge region of the back surface of circuit board 11, is removed. The metal film 20 is then formed on the back surface of the circuit board 11, with its edge being separated from the edge of the circuit board 11 by distance L1 (about 2-3 mm). The etching process is carried out in a state where the conductive pattern 13 formed in the previous process is entirely covered with the resist 27.

Figure 6D:
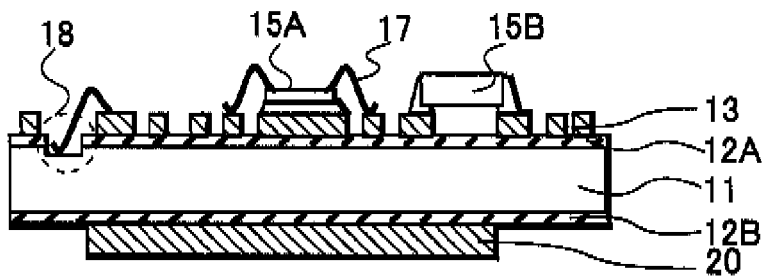
Figure 6E:
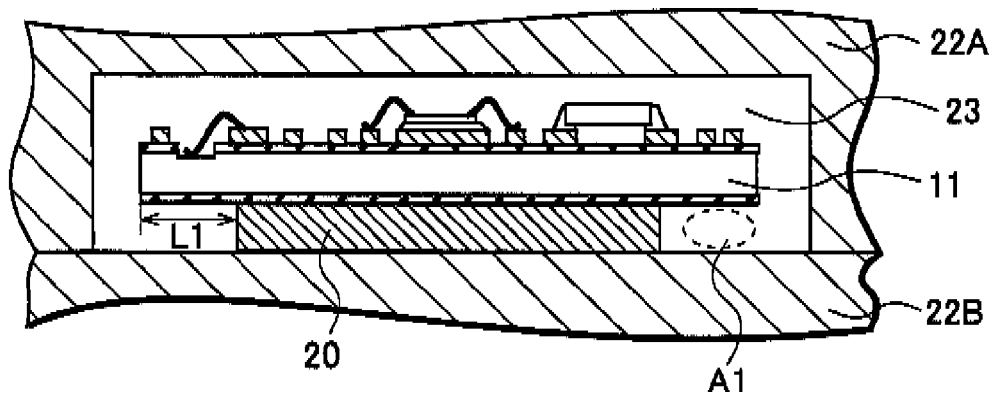

After the conductive pattern 13 and the metal film 20 are formed in the foregoing processes, the semiconductor element 15A and the chip element 15B are fixed to the conductive pattern 13, as shown in FIG. 6D. Furthermore, as shown in FIG. 6E, a resin sealing process is carried out in a state where the back surface of the metal film 20 is in contact with the lower mold 22B. The detailed description of these processes is similar to that provided before.

The hybrid integrated circuit device 10 undergone the foregoing molding process is then conveyed to an after-curing process to cure the sealing resin, where a furnace is used for heating. Thus, a hybrid integrated circuit device shown in, for example, FIGS. 1A to 1C, is completed. In addition, since the circuit board 11 is covered with the sealing resin 14 including its back surface, warpage of the circuit board 11 due to the cure shrinkage of the sealing resin 14 can be prevented.

Next, a method of manufacturing the hybrid integrated circuit device shown in FIG. 3C will be described with reference to FIGS. 7 to 8.

Figure 7A:
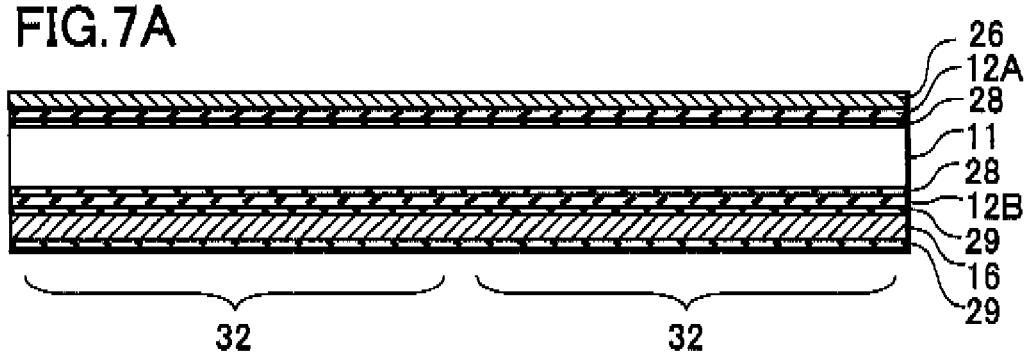
FIGS. 7A to 7D are sectional views showing the method of manufacturing the hybrid integrated circuit device of the preferred embodiment of the present invention.

Referring to FIG. 7A, a conductive foil 26 is first adhered to the front surface of the circuit board 11, and the metal board 16 to its back surface. Here, the conductive foil 26 is formed on the front surface of the circuit board 11 with the first insulating layer 12A interposed therebetween. The metal board 16 is adhered to the back surface of the circuit board 11 with the second insulating layer 12B interposed therebetween. By way of example, the conductive foil 26 is about 70 μm in thickness; the circuit board 11 is about 1.5 mm in thickness; and the metal board 16 is about 0.5 mm in thickness. In addition, the first and second insulating layers 12A and 12B are about 50-60 μm in thickness.

The circuit board 11 is of such a size that it can accommodate, for example, few dozens of unit 32 arranged in a matrix. Here, "unit" means an area in the circuit board 11, which forms one hybrid integrated circuit device.

For the circuit board 11 and the metal board 16, aluminum, cupper, iron and the like can be used. Here, by way of example, an aluminum board whose front and back surfaces are anodized is adapted for the circuit board 11 and the metal board 16.

The front and back surfaces of the circuit board 11 are covered with an oxide film 28. The oxide film 28 is an anodized aluminum film containing Al2O3, and is about 1-5 μm in thickness. Provision of such a thin oxide film 28 can reduce its heat resistance.

The front and back surfaces of the metal board 16 are covered with an oxide film 29 with a thickness of about 10 μm. By making the oxide film 29 relatively thicker, it is made possible to protect the back surface of the metal board 16 from etchants in the downstream etching process, and furthermore, to protect it against damage in the process for conveying the circuit board 11 from one process to another.

Figure 7B:
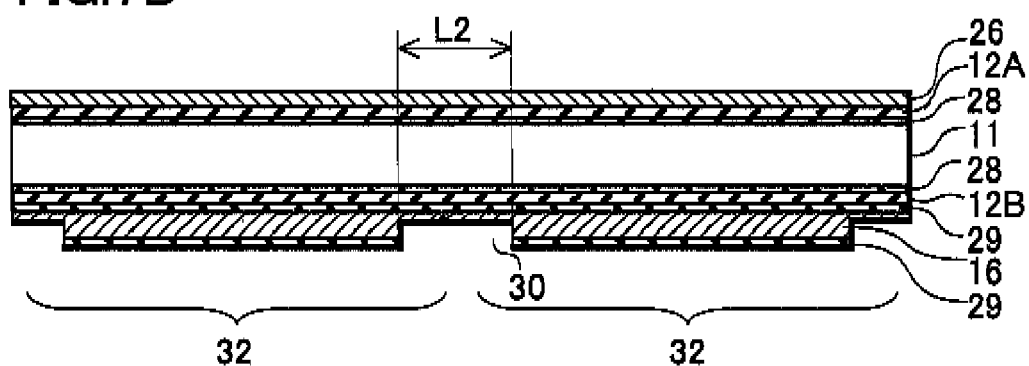

Referring to FIG. 7B, separation grooves 30 are formed in regions that correspond to the boundaries among units. Here, the metal board 16, and the oxide film 29 formed on the back surface of the metal board 16 are grinded and partially removed by dicing using a cutting saw. Here, the separation grooves 30 are so formed that they have a depth that is smaller than the thickness of the metal board 16. Here, the separation grooves 30 with a depth of about 0.4 mm are formed in the metal board 16 with a thickness of about 0.5 mm. Thus, the metal board 16 with a thickness of about 0.1 mm still remains in the regions where the separation grooves 30 are formed.

By forming the separation grooves 30 with a small portion of the metal board 16 remained therein as described above, it is made possible to protect the second insulating layer 12B provided on the upper surface of the metal board 16 against damage. To be more specific, the separation grooves 30 have variations in the thickness of the remaining metal board 16 because they are formed by dicing using a cutting saw. For this reason, when the separation grooves 30 with a depth that is similar to the thickness of the metal groove 16 are formed, the cutting saw may damage the second insulating layer 12B. If the second insulating layer 12B is damaged, the back surface of the circuit board 11 may have a poor dielectric strength. Thus, in this embodiment, the second insulating layer 12B is protected from a cutting saw by making the depth of the separation grooves 30 small to an extent that the metal board 16 remained therein will not be partitioned.

The width (L2) of the separation grooves 30 is set to be 2 times as large as the distance L1 shown in, for example, FIG. 1B. More specifically, the width (L2) is about 4-6 mm or more. Thus, it is ensured that the circuit board 11 and the metal board 16 are insulated from each other in the respective units 32.

Figure 7C:
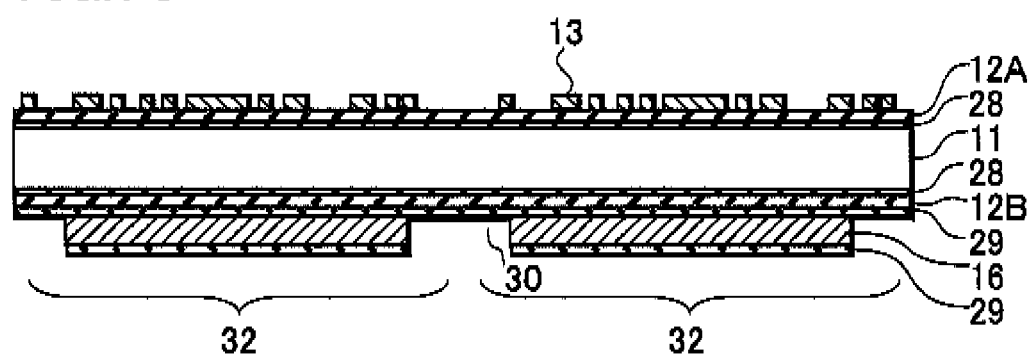

Referring to FIG. 7C, the conductive foil 26 is then patterned by etching to form the conductive pattern 13. Furthermore, the thickness portion of the metal board 16 remained in the regions where the separation grooves 30 are formed is removed.

The conductive pattern 13 is formed by etching the conductive foil 26 through the use of a resist provided thereabove. In addition, this etching process is carried out after soaking the whole circuit board 11 in an etchant.

In this process, the conductive foil 26 and the metal board 16 are etched separately because aluminum, the material of the metal board 16, will generate dangerous hydrogen gas upon exposure to an acidic etchant that is used for the etching of the conductive foil 26 made of cupper. Specifically, when the conductive pattern 13 is formed by etching the conductive foil 26, the separation grooves 30, where aluminum is exposed, are covered with a resist. In addition, when the metal board 16 remained in the regions where the separation grooves 30 are formed is removed, the conductive pattern 13 is covered with a resist. Here, the conductive foil 26 and the metal board 16 may be etched simultaneously. In this case, it is possible to reduced the number of processes.

Figure 7D:
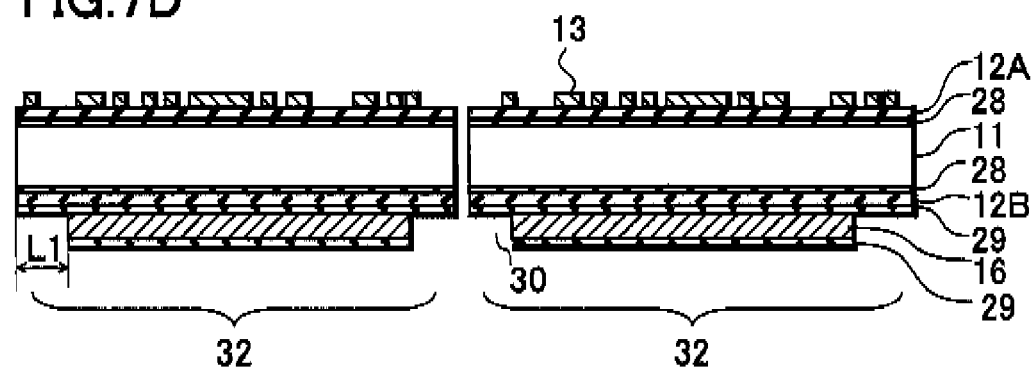

Referring to FIG. 7D, the circuit boards 11 in the unit 32 are separated from each other. This separation operation is performed by, for example, press cutting, dicing or bending. Here, when the circuit boards 11 are separated from each other by dicing or bending, separation grooves may be formed on the front or back surfaces of the regions that correspond to the boundaries among the circuit boards 11 in the units 32. This facilitates separation of the circuit boards 11.

Figure 8A:
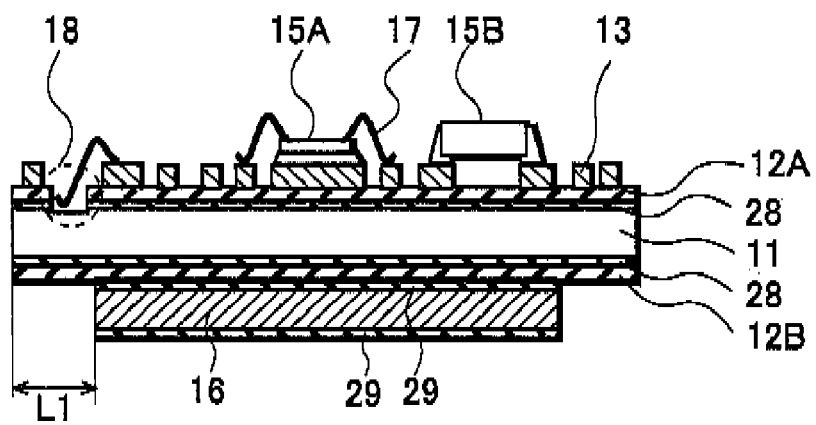
FIGS. 8A and 8B are sectional views showing the method of manufacturing the hybrid integrated circuit device of the preferred embodiment of the present invention.

Referring to FIG. 8A, circuit elements are then electrically connected to the conductive pattern 13. Here, the semiconductor element 15A and the chip element 15B are fixed to the conductive pattern 13. In addition, the semiconductor element 15A is electrically connected to the conductive pattern 13 with the metal wire 17. This process may be carried out before separating the units 32 from each other.

Figure 8B:
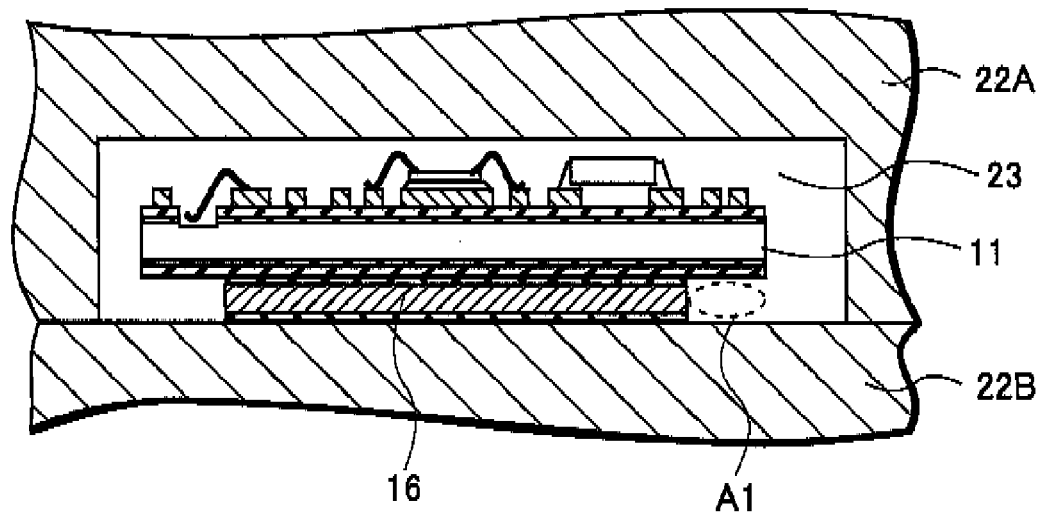
Figure 9:
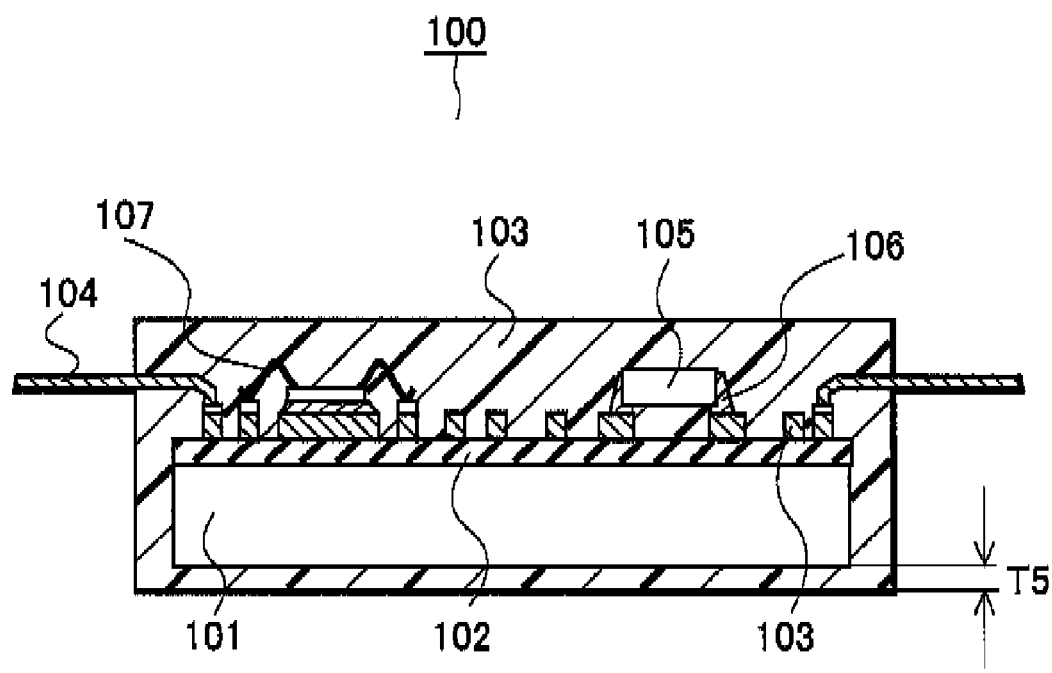
FIG. 9 is a sectional view showing a conventional hybrid integrated circuit device.

Referring to FIG. 8B, sealing resin is then formed in such a way as to cover the circuit board 11. Firstly, the back surface of the metal board 16 provided below the circuit board 11 is allowed to come in contact with the lower mold 22B. The upper and lower mold 22A and 22B are then allowed to come in contact with each other, whereby the circuit board 11 is housed in a cavity 23. The metal board 16 is adhered to the back surface of the circuit board 11, except for its edge region. Thus, the edge region of the circuit board 11 is separated from the lower mold 22B by the distance corresponding to the thickness of the metal board 16, and therefore, the sealing resin injected in the cavity 23 spreads throughout the space A1 below the circuit board 11.

A hybrid integrated circuit device as shown in FIG. 3A is manufactured through the foregoing processes.

According to the preferred embodiment of the present invention, the edge region of the back surface of the circuit board is covered with sealing resin. Accordingly, an anchor effect is brought about by the sealing resin, making it possible to increase the bonding strength between the sealing resin and the circuit board.

Furthermore, according to the preferred embodiment of the present invention, a sufficient dielectric strength can be secured between the circuit board and the outside, with the back surface of the circuit board exposed from the sealing resin to the outside. Thus, it is made possible to provide a circuit device with heat radiation capability and dielectric strength.

Furthermore, according to the method of the preferred embodiment of the present invention for manufacturing a circuit device, the edge region of the back surface of the circuit board can be separated from a mold during a resin sealing process using the mold. Thus, it is made possible to cover the edge region of the back surface of the circuit board with the sealing resin.

What is claimed is:

1. A circuit device, comprising:
    a circuit board made of metal having
        a first insulating layer covering an entire front surface of the circuit board, and
        a second insulating layer covering an entire rear surface of the circuit board;
    an electric circuit constituted of a conductive pattern and a circuit element, both of which are formed on the surface of the first insulating layer;
    sealing resin for encapsulating the electric circuit, the sealing resin covers the front and side surfaces of the circuit board as well as the edge region of the rear surface of the circuit board, with the second insulating layer being partially exposed; and
    a metal board fixed to the rear surface of the second insulating layer and a rear surface of the metal board is exposed from the sealing resin,
    wherein a metal material of the circuit board is exposed at a side surface of the circuit board and separated from the metal board.

2. The circuit device according to claim 1,
    wherein the circuit board and the electric circuit are electrically connected together.

3. The circuit device according to claim 1,
    wherein the circuit board is connected to a ground potential with the conductive pattern.

4. The circuit device according to claim 1,
    wherein an oxide film is formed on the rear surface of the metal board.

5. The circuit device according to claim 1,
    wherein a planar surface is formed, which is formed of the exposed surface of the metal board and the sealing resin.

6. The circuit device according to claim 1,
    wherein at least 2 mm of the edge region of the rear surface of the circuit board from an end of the circuit board is covered with the sealing resin.

7. The circuit device according to claim 1,
    wherein heat releasing means is fixed to the rear surface of the circuit board.

8. The circuit device according to claim 1,
    wherein the conductive pattern is electrically connected to the circuit board by a connecting portion, such that, at the connecting portion, the first insulating layer is partially removed to expose a surface of the circuit board and the exposed surface of the circuit board is connected to the conductive pattern via a wire.

9. The circuit device according to claim 1,
    wherein a first end of a lead is connected to the conductive pattern and a second end of the lead is lead out from the sealing resin.

10. The circuit device according to claim 1,
    wherein a fin is attached to the rear surface of the metal board.

* * * * *